United States Patent
Prouet et al.

(10) Patent No.: US 11,099,598 B2
(45) Date of Patent: Aug. 24, 2021

(54) PHASE ALIGNMENT OF A CONTROLLER CLOCK TO A FIELD

(71) Applicant: NXP B.V., Eindhoven (NL)

(72) Inventors: Sebastien Prouet, Gavrus (FR); Stefan Brennsteiner, Hollersbach (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/797,116

(22) Filed: Feb. 21, 2020

(65) Prior Publication Data
US 2020/0278716 A1    Sep. 3, 2020

(30) Foreign Application Priority Data

Feb. 26, 2019    (EP) ..................................... 19305221

(51) Int. Cl.
| | | |
|---|---|---|
| G06F 1/08 | (2006.01) | |
| H03L 7/093 | (2006.01) | |
| H03L 7/099 | (2006.01) | |
| H04B 5/00 | (2006.01) | |

(52) U.S. Cl.
CPC ................ G06F 1/08 (2013.01); H03L 7/093 (2013.01); H03L 7/0992 (2013.01); H04B 5/0031 (2013.01); H03L 2207/50 (2013.01)

(58) Field of Classification Search
CPC combination set(s) only.
See application file for complete search history.

(56) References Cited

U.S. PATENT DOCUMENTS

| | | | | |
|---|---|---|---|---|
| 7,956,615 B1* | 6/2011 | Jaoude | ................. | G01R 31/389 324/430 |
| 7,962,109 B1* | 6/2011 | Stockstad | ............ | H03G 3/3047 455/115.1 |
| 7,977,919 B1* | 7/2011 | Jaoude | ..................... | H04B 1/06 320/136 |
| 2006/0132955 A1* | 6/2006 | Annampedu | .... | G11B 20/10009 360/49 |
| 2009/0256740 A1* | 10/2009 | Teshirogi | ................ | G01S 7/282 342/204 |
| 2010/0233977 A1* | 9/2010 | Minnis | ................. | H04B 1/0475 455/127.1 |

(Continued)

FOREIGN PATENT DOCUMENTS

| | | |
|---|---|---|
| EP | 2625653 B1 | 11/2014 |
| EP | 3429087 A1 | 1/2019 |

(Continued)

*Primary Examiner* — Adam D Houston

(57) ABSTRACT

Disclosed as a clock alignment module for a near field communication, NFC, controller operable in active load modulation, ALM, card mode, the module being operable during a transmit mode comprising transmit bursts and comprising: an input for receiving a field clock signal (CLK_FIELD); an output for outputting a local controller clock signal (CLK_FB); a transmit envelop unit configured to determine whether a time since an end of a latest transmit burst exceeds a threshold, Tdelay; and a phase locked loop, PLL, configured to selectively lock the phase of the local controller clock signal to the phase of the field clock signal, in response to the time exceeding the threshold and a next transmit burst not having started. Associated NFC controllers, integrated circuits and methods are also disclosed.

18 Claims, 6 Drawing Sheets

(56) References Cited

U.S. PATENT DOCUMENTS

| | | | |
|---|---|---|---|
| 2011/0121866 A1* | 5/2011 | Suzuki | H04N 9/642 327/105 |
| 2011/0122921 A1* | 5/2011 | McCorkle | H04B 1/7176 375/130 |
| 2013/0215979 A1* | 8/2013 | Yakovlev | H04B 5/0031 375/256 |
| 2014/0273830 A1* | 9/2014 | Wong | G06K 7/0008 455/41.1 |
| 2015/0065043 A1* | 3/2015 | Heng | H04L 7/0041 455/41.1 |
| 2016/0105188 A1* | 4/2016 | Cho | H03L 7/0805 375/374 |
| 2016/0197718 A1* | 7/2016 | Michel | G06K 19/0723 375/300 |
| 2016/0241380 A1 | 8/2016 | Ghahramani | |
| 2016/0294541 A1* | 10/2016 | van de Beek | H03L 7/23 |
| 2018/0034621 A1* | 2/2018 | Hueber | H04B 5/0075 |
| 2018/0198489 A1* | 7/2018 | Leow | H04B 5/0068 |
| 2019/0086517 A1* | 3/2019 | Puglia | G01S 7/4817 |
| 2020/0278716 A1* | 9/2020 | Prouet | H03L 7/093 |
| 2020/0343856 A1* | 10/2020 | Aboudina | H03L 1/027 |
| 2021/0026454 A1* | 1/2021 | Hong | G06K 9/4628 |
| 2021/0067203 A1* | 3/2021 | Hoelzl | H04B 5/0031 |
| 2021/0111758 A1* | 4/2021 | Pichler | H04B 5/0031 |

FOREIGN PATENT DOCUMENTS

| | | |
|---|---|---|
| GB | 2406023 A | 3/2005 |
| WO | 2012038664 A2 | 3/2012 |

\* cited by examiner

PHASE ALIGNMENT OF A CONTROLLER CLOCK TO A FIELD

CROSS-REFERENCE TO RELATED APPLICATIONS

This application claims priority under 35 U.S.C. § 119 to European Patent Application No. 19305221.4, filed on Feb. 26, 2019, the contents of which are incorporated by reference herein.

FIELD

The present disclosure relates to for near field communication, NFC, controllers and integrated circuits and clock alignment modules therefor, and in particular to those operable in active load modulation (ALM) card mode. It also relates to methods for aligning controller clocks to field clocks for NFC applications.

BACKGROUND

When operating in card mode with active load modulation (ALM), NFC controllers require a clock which is aligned in phase with the field clock during transmit mode when the NFC controller is transmitting, in other words the local clock needs to be aligned with the phase of the field signal generated by the reader, during this time.

However, when the controller is transmitting the modulation signal, it is not practical to use the same antenna to receive the field signal in order to determine the field clock. It is known to include a voltage controlled oscillator in a phase locked loop in the controller, and leave this free running during the whole transmission, however this solution results in significant phase shift, unless a dedicated external highly accurate reference frequency is introduced to reach the required frequency stability. Such a highly accurate reference frequency incurs additional bill of material costs, or in some applications may not available at all. There thus remains a problem of ensuring phase alignment during the transmission, without relying on a dedicated accurate reference frequency.

SUMMARY

According to a first aspect of the present disclosure, there is provided a clock alignment module for a near field communication, NFC, controller operable in active load modulation, ALM, card mode, the module being operable during a transmit mode configured to generate transmit bursts, and comprising: an input for receiving a field clock signal (CLK_FIELD); an output for outputting a local controller clock signal (CLK_FB); a transmit envelop unit configured to determine whether a time since an end of a latest transmit burst exceeds a threshold, Tdelay; and a phase locked loop, PLL, configured to selectively lock the phase of the local controller clock signal to the phase of the field clock signal, in response to the time exceeding the threshold and a next transmit burst not having started. The clock alignment module may be a clock alignment circuit. Thus, it may be possible to avoid a requirement to actively damp the antenna circuit between bursts, since only during longer bursts, is the antenna used to pick up the field signal.

In one or more embodiments the PLL comprises a digitally controlled oscillator and a frequency divider, and is configured to generate the local controller clock signal from a signal (CLK_DCO) output by the digitally controlled oscillator and frequency divided by the frequency divider.

In one or more embodiments the PLL is configured to allow the digitally controlled oscillator to run freely without locking the phase of the local controller clock signal to the phase of the field clock signal, in response to the time between transmit bursts not exceeding the threshold. Since any encoding of information transmitted by the controller includes some longer and some shorter gaps between bursts, the DCO may continue to run free during the shorter gaps, but is phase aligned in phase to the field, during the later part of the longer gaps.

In one or more embodiments the transmit envelop unit comprises a state machine counter configured to be reset at the end of each transmit burst. This may provide for the start of determining the gaps between bursts.

In one or more embodiments the PLL comprises a linear phase detector, LPD, configured to compare the phase of the local controller clock signal (CLK_FB) and the field clock signal (CLK_FIELD) and a digital loop filter.

In one or more embodiments the clock alignment module is further operable in a receive mode, and further comprises an input for receiving a receive-mode signal indicative of operation in the receive mode, and the phase locked loop is further configured to lock the phase of the local controller clock signal to the phase of the field clock signal in response to the receive-mode signal. This may ensure that the phases are aligned, at the end of the receive-mode and the start of a transmit mode.

According to another aspect of the present disclosure, there is provided an NFC controller comprising a clock alignment module as described above, an active modulator configured to generate modulations in a signal having a predefined phase relationship with the local controller clock signal, and an antenna configured to transmit the modulated signal. The predefined phase relationship typically includes a phase offset between the two signals.

In one or more embodiments the clock alignment module further comprises one or more control parameter inputs configured to receive control parameters, for adjusting the gain of the PLL in dependence on whether the control is operating in a transmit mode or a receive mode. The relevant control parameters, relevant to operation transmit mode or receive mode may be selected by means of a multiplexer unit.

According to yet another aspect of the present disclosure, there is provided an integrated circuit for use in an NFC controller as just described, and comprising a clock alignment module as described above, and an active modulator configured to generate a modulation in a signal having a predefined phase relationship with the local controller clock signal.

According to yet further aspect of the present disclosure, there is provided a method of aligning a local controller clock signal (CLK_FB) to a receiving a field clock signal (CLK_FIELD) in an NFC controller operable in active load modulation card mode, during a transmit mode comprising transmit bursts, the method comprising: determining, by means of a transmit envelop unit, whether a time since an end of a latest transmit burst exceeds a threshold, Tdelay; and selectively locking the phase of the local controller clock signal to the phase of the field clock signal, in response to the time exceeding the threshold and a next transmit burst not having started.

In one or more embodiments determining whether a time since an end of a latest transmit burst exceeds a threshold, Tdelay comprises: resetting a state machine counter at the end of each transmit burst; incrementing the state machine counter at a predetermined rate; and comparing the state machine counter with the threshold.

In one or more embodiments the method further comprises locking the phase of the local controller clock signal to the phase of the field clock signal, in response to the NFC controller operating in a receive mode.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be otherwise embodied as a non-transient signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
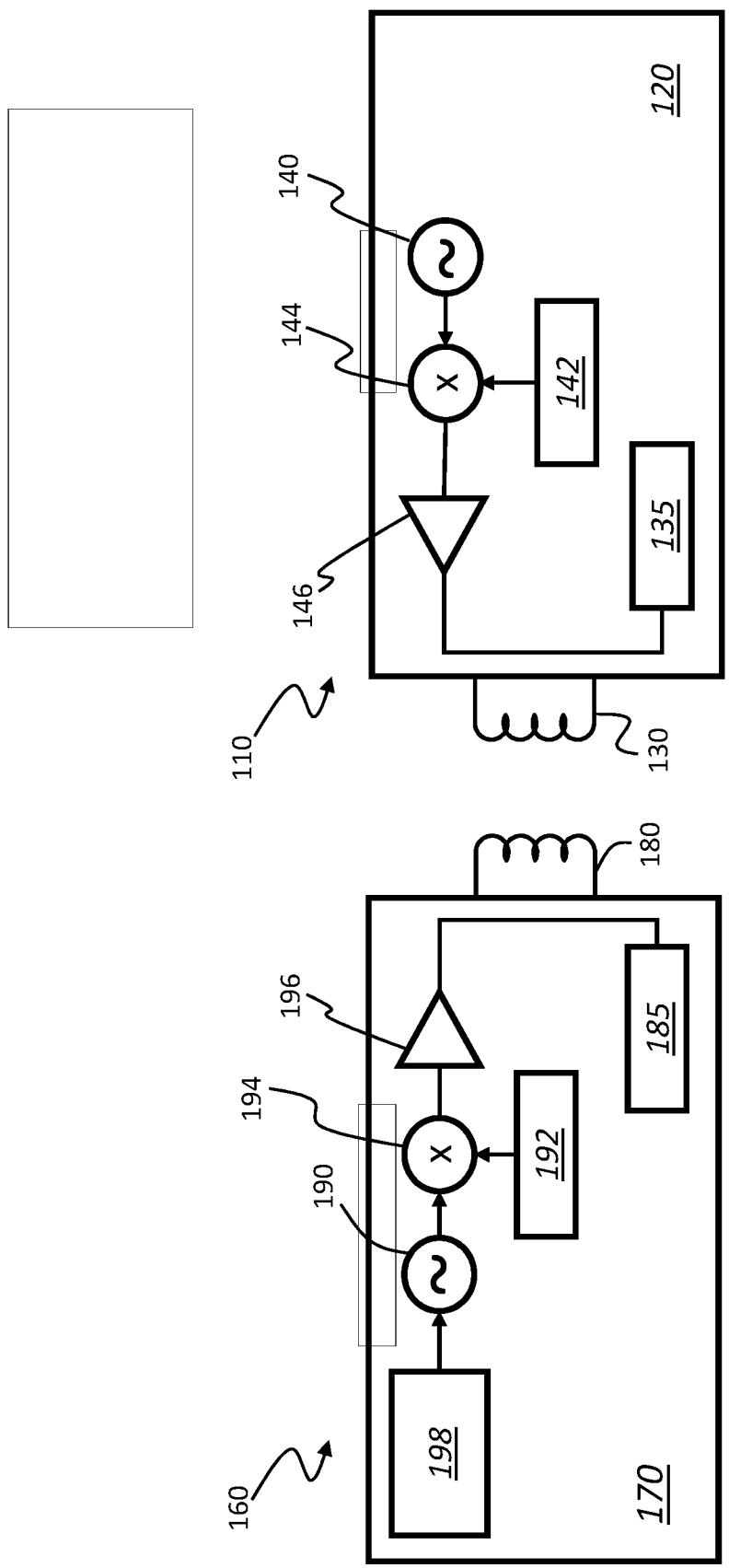
FIG. 1 illustrates, schematically, basic NFC communication with active load modulation (ALM)

It should be noted that the Figures are diagrammatic and not necessarily drawn to scale. Relative dimensions and proportions of parts of these Figures may be shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 shows a basic schematic of an NFC communication system with active load modulation. The system comprises a reader 110, and an NFC controller 160, which may be configured to operate in card mode. The reader includes a reader integrated circuit (IC) 120 and an antenna 130; the NFC controller includes a card IC 170 and an antenna 180. Each of the reader and controller include a receiver module, 135 and 185 respectively.

The reader IC includes a clock generator 140, which may be embodied as a voltage-controlled oscillator or other high frequency oscillator, which produces a high frequency signal, CLK_FIELD. The reader further comprises a modulator 142 which encodes a—relatively—low frequency binary signal. As shown at mixer 144, the low frequency signal is applied to the high-frequency signal to modulate it by amplitude modulation. The modulated high frequency (field) signal is transmitted by means of antenna 130, via front-end amplifier 146.

The field signal may be received by the antenna 180 of the controller, and then converted in the receive module 185 of the controller. This provides for one-way communication between the reader and controller.

For communication between the controller and reader, there exists two possibilities: in passive load modulation (not shown), the load attached to antenna 180 may be varied, in a binary fashion, according to information to be transmitted. In turn, this perturbs the field of the transmitted high-frequency (field) signal. The perturbation may be measured by the reader, and the variation in load determined. Since the load varies according to the information trend to be transmitted, this information may be recovered at the reader.

However, more relevant to the present disclosure, is the alternative of active load modulation, shown in FIG. 1. In this scenario, the controller transmits its own signal. The controller generates its own high-frequency signal, at local clock 190. The modulation signal, generated in modulator 192, is mixed with the high-frequency signal at mixer 194, and the result is transmitted by the antenna 180, for reception by the reader's antenna 130, via front-end amplifier 196.

Active load modulation may generate a more powerful modulation than passive mode modulation, since a separate signal is generated, rather than relying on a load modulation producing a perturbation in an existing field. However, in order to identify the modulated signal, the high frequency signal from the card must have effectively the same frequency, and must be in phase or at least have a known phase relationship avoiding orthogonality, with the field signal. In order to achieve this, the local clock 190 of the controller must be aligned, both in frequency and phase, with the field clock. This is the function of the field phase alignment module 198. The field phase alignment module 198 receives the CLK_FIELD signal from the receive module after a front-end amplification, for instance to transform voltage swings at the antenna at the field frequency—which typically may be 13.56 MHz—into a real clock signal which can be processed by the field phase alignment module 198.

It would be possible to measure the field phase information, whilst transmitting, by using double loop active load modulation (DLALM), with one antenna part dedicated to transmit and one antenna part dedicated to sense the field phase information. However, DLALM is relatively expensive in terms of the bill of materials, and single loop active load modulation (SLALM) is preferred. A problem arises, in that, in a SLALM controller, the field phase information is not available when the controller is itself transmitting, and thus cannot be used to ensure this phase alignment. By "single loop" in this context is meant a controller in which there is only one antenna—which can be either transmitting or receiving at any one instance but not both.

In order to mitigate this problem, controllers have been developed in which a voltage-controlled oscillator (VCO), or digitally controlled oscillator (DCO) is embedded in a phase locked loop in the controller. The oscillator is locked onto the field phase during controller reception intervals. The VCO is left free running when the controller is operating in transmit mode—when the phase information is not available. In practice, such a free running oscillator suffers from a very large phase drift. Causes of the drift include the oscillator's own thermal and flicker noise, and its sensitivity to supply voltage and temperature changes, which typically occur when the integrated circuit is switched from a receive (or idle) mode to a transmit mode. It has been proposed to re-synchronise the oscillator with the field phase during transmission, by sensing the field between each transmit burst. However, this requires adding additional and specific circuitry to damp the antenna oscillation between the bursts so that the oscillator is able to lock onto the field phase information in the given time between bursts. Such antenna damping tends to limit the transmitter performance.

In order to address this issue, there is disclosed herein a clock alignment module for a near field communication, NFC, controller operable in active load modulation, ALM, card mode, the module being operable during a transmit mode comprising transmit bursts, and comprising: an input for receiving a field clock signal (CLK_FIELD); an output for outputting a local controller clock signal (CLK_FB); a transmit envelop unit configured to determine whether a time since an end of a latest transmit burst exceeds a threshold, Tdelay; and a phase locked loop, PLL, configured to selectively lock the phase of the local controller clock signal to the phase of the field clock signal, in response to the time exceeding the threshold and a next transmit burst not having started.

Thus, the VCO is still resynchronised between transmission bursts, but the transmission modulation content is analysed such that the VCO phase resynchronisation takes place selectively—that is, only during longer bursts. The analysis is done by means of a transmit envelope unit. The unit is configured to determine whether a time since an end of the latest transmit burst exceeds a threshold, Tdelay. During an active transmit burst, the end of that latest transmit burst has not been reached, such that the transmit envelope unit does not determine that the time exceeds the threshold. The threshold is set such that the antenna is known to be sufficiently damped within time Tdelay such that the antenna may be used to effectively sense the field, prior to the antenna being commandeered for the next transmission burst.

Put in other words, the phase information in the digital PLL is selectively updated over time between transmission bursts, rather than being updated between each and every transmission burst.

Figure 2:
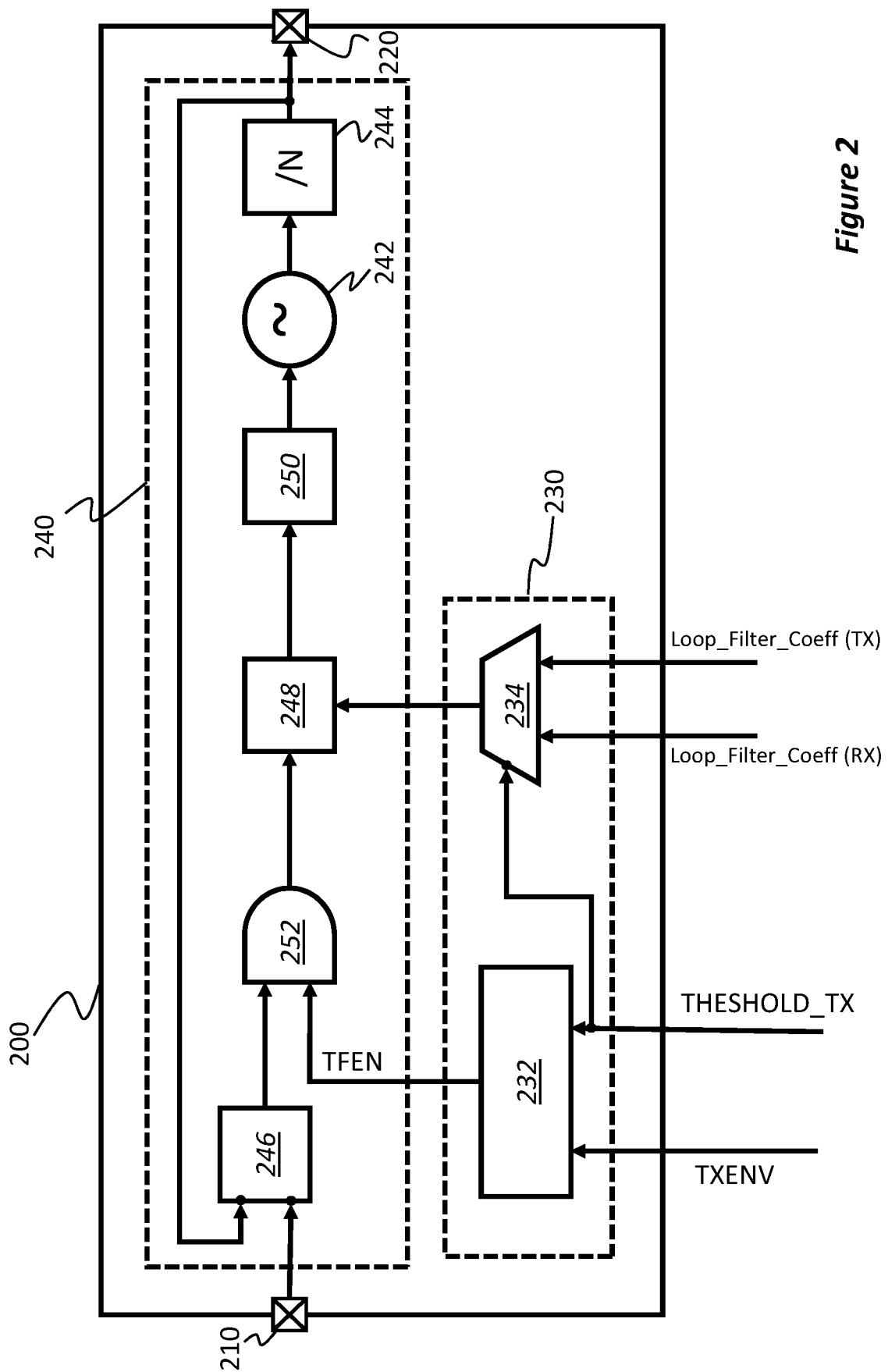
FIG. 2 shows a clock alignment module according to embodiments of the present disclosure.

A clock alignment module 200 according to one or more embodiments is shown in FIG. 2. The clock alignment module 200 includes an input 210, for receiving a field clock signal (CLK_FIELD). An output 220 is provided for outputting a local controller clock signal (CLK_FB). The module includes a transmit envelop unit 230. The unit is configured to determine whether a time since an end of the latest transmit burst exceeds a threshold, Tdelay. Furthermore, the module 200 includes a phase locked loop, PLL, 240 configured to selectively lock the phase of the local controller clock signal to the phase of the field clock signal, in response to the time exceeding the threshold—and the next transmit burst not having started.

As shown in FIG. 2, the PLL 240 comprises a digitally controlled oscillator, DCO, 242 and a divide-by-N frequency divider 244. The PLL is configured to generate the local controller clock signal from a signal (CLK_DCO) output by the digitally controlled oscillator and frequency divided by the frequency divider.

Furthermore, the PLL comprises a linear phase detector, LPD, 246, configured to compare the phase of the local controller clock signal (CLK_DCO) and the field clock signal (CLK_FIELD). As will be familiar to the person skilled in the art, the linear phase detector 246 outputs a digital signal which is proportional to the phase mismatch between the local controller clock signal and the field clock signal. The skilled person will appreciate, that for typical classical digital phase locked loops, a binary phase detector may be used in place of the linear phase detector 246. However, such a system is very sensitive to phase noise at both inputs of the phase detector since the phase detector equivalent gain (and hence the PLL loop dynamics) is inversely proportional to the phase noise of its inputs. So a linear phase detector is preferred over a binary phase detector in the present application since the phase detector equivalent input phase noise is high during transmit (the phase alignments slots are rarer and not deterministic, resulting the possibility of up to a few degrees of phase drift during long slots without update).

The PLL further comprises a digital loop filter 248. In some alternative embodiments, an analog loop filter may be used in place of the digital loop filter, as part of an analog system (i.e. one having an analog phase detector, analog filter, and analog VCO). But a digital system can be significantly more flexible, and implementation in a digital system reduces the design complexity. The PLL further comprises a sigma delta modulator 250. As will be familiar to the person skilled in digital PLL design, a delta sigma modulator is typically used together with the DCO to effectively increase the resolution of the DCO. For instance, a DCO such as that shown in FIG. 2 may have as few as 4 bits to control its frequency. A small number of bits allows for simple design of the DCO. Putting a delta sigma modulator in front can increase the equivalent resolution for instance up to 17 bits. With such a resolution, the equivalent DCO "resolution noise" (that is to say, the jitter associated with one LSB code change) is smaller than the DCO natural phase noise.

As shown in FIG. 2, in some embodiments the PLL also comprise combinatorial logic 252, which as shown may be an "AND" circuit. In one or more other embodiments, the PLL comprises a flip-flop instead of the combinatorial AND (or NAND) logic; this will be discussed further with reference to FIG. 3. The function of this 'AND' circuit is to ensure that when the control is operating in a transmit mode, the phase of the DCO is only locked when both (a) the controller is not actively transmitting; that is to say, during a period between bursts, (which, in some encoding schemes, may be equivalent to being during a "0" in the binary transmission signal), and (b) sufficient time has elapsed since the end of the last burst for the resulting current in the antenna to have damped far enough to be able to determine the phase of the field by sensing the induced current in the antenna circuit. In other words, (in the encoding scheme mentioned above), there has been a delay of at least Tdelay since the end of transmitting the latest "1" in the transmission. It should be noted, that in general the simple "1 is on, and 0 is off" encoding scheme mentioned above, is not deployed in NFC: rather, as will be discussed in more detail below, more balanced encoding schemes such as Manchester Encoding are generally used.

In order to determine that both of these conditions are met, the transmit envelop unit 230 includes a state machine counter 232. The state machine counter is configured to be reset at the end of each transmit burst. To this end, it receives an input TXENV, corresponding to the envelope of the transmission signal, from which it is possible to determine the moments at which the state counter is to be reset. That is to say the state counter is reset on each falling edge of the TXENV transmission signal.

It also has as an input, a value of THESHOLD_TX. This input is set at a level to determine the value of the threshold delay such that the PLL is only enabled once the antenna current has been damped sufficiently, as described above. For example, in an implementation at which the field clock is oscillating at 13.56 MHz, the clock interval is around 73.7 ns. The threshold may then be set at a value of around 737 ns for instance. This will result in the PLL being enabled only if the delay between bursts lasts for at least 10 complete clock cycles; conversely, the threshold will not be reached if the delay is only 8 clock cycles for instance (ie the duration of one half of a bit for instance in the example of FIG. 4). The exact threshold may be varied to another value than 737 ns in this example, depending on the damping of the actual system. The skilled person will appreciate that there is scope to adjust the damping by varying, for instance, the transmit equivalent resistance.

When this condition—that the threshold delay has been passed—is met, the signal TFEN at output from state machine counter 232 is high, and the combinatorial logic 252 enables the PLL to operate.

Conversely, when the condition is not the met, the combinatorial logic 252 precludes operation of the PLL. Under those conditions, which correspond to the time between transmit bursts not exceeding the threshold, the digitally controlled oscillator input control word is not adjusted based on the current phase error detected at LPD output i.e. the phase of the local controller clock signal is not locked to the current phase of the field clock signal.

In the embodiment shown, the transmit envelope unit 230 also has a multiplexor or mux unit 234, which has two inputs "loop filter coefficient (RX)" and "loop filter coefficient (TX)". This forms a tracking control block, whose function is to adjust the PLL operation in dependence on whether the controller is operating in transmit or receive mode. The skilled person will appreciate that for a proportional path and integral path (PI) digital phase lock loop, the pass gain may be defined through a set of coefficients, Ki, Kp. This set of coefficients (Ki,Kp) together with other parameters (DCO gain, reference frequency, . . . ) will determine the PLL behaviour such as the PLL loop bandwidth. In receive mode, the PLL reference frequency is (typically) 13.56 MHz since the phase error information (at the input of the digital filter) is updated every field clock cycle, and this is 13.56 MHz in a typical application. In transmit mode, the PLL equivalent reference frequency is greatly reduced since the phase error is updated at a far lower rate. This rate depends on factors including the standards to be transmitted, the choice of Tdelay, and the relative frequency of occurrence of 0-1 transitions in the binary information to be transmitted. In some cases, for instance in an example having Tdelay>8 cycles of a 13.56 MHz field clock, an equiprobability of 0,1 bits to be transmitted, and a B106k standard to be transmitted (as defined ISO IEC 14443) the equivalent phase error update rate falls a few tens of kHz. So the loop filter coefficient must be adjusted to cope with this change in the phase error update rate during transmit mode, relative to receive mode. The mux unit 234 is provided to select the proper set of coefficients depending on the NFC controller state (RX or TX) prescribed by the digital control part of the NFC controller.

Figure 3:
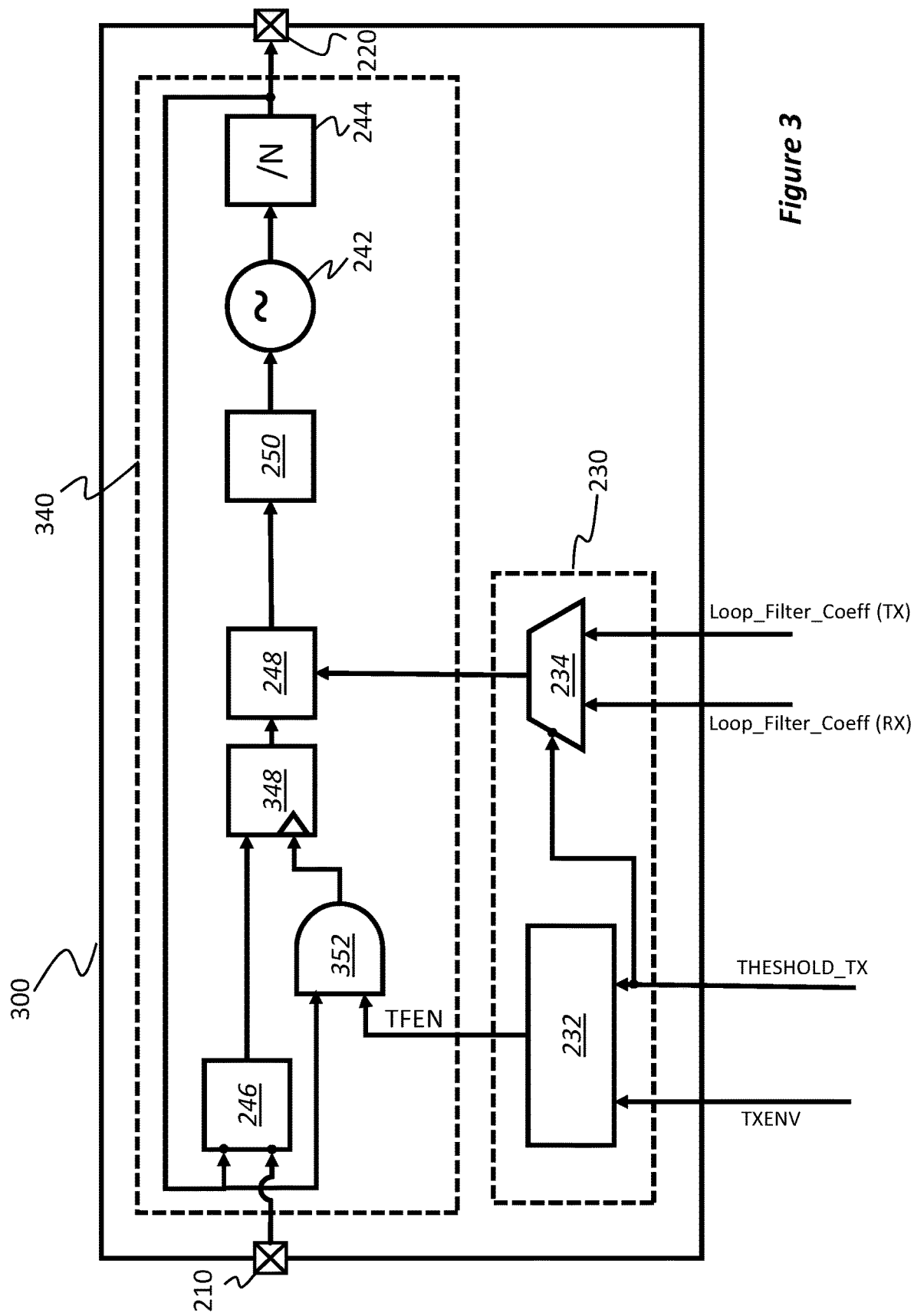
FIG. 3 shows a clock alignment module according to other embodiments of the present disclosure.

As mentioned above, a flip-flop may be used as an alternative to the combinatorial AND or NAND logic. This is shown in FIG. 3. The clock alignment module 300 shown in FIG. 3 is similar to that shown in FIG. 2, except that the PLL 340 includes a set-reset flip-flop 348 with clock gating. The "AND" circuit forces the phase error to be 0 at the filter input when the TFEN signal is low. The flip-flop implementation freezes the phase error at the latest value at the filter input. The principle of operation is the same as that for the embodiment illustrated in FIG. 2, that is to say the phase error is only updated during the appropriate selected time window depending on the signal to be transmitting, but the behaviour is slightly different. In this embodiment, the flip-flip implementation adds inertia and allows correcting the updated phase error in a smoother way compared to an AND or NAND implementation, and may offer better overall behaviour, which may be preferred.

Figure 4:
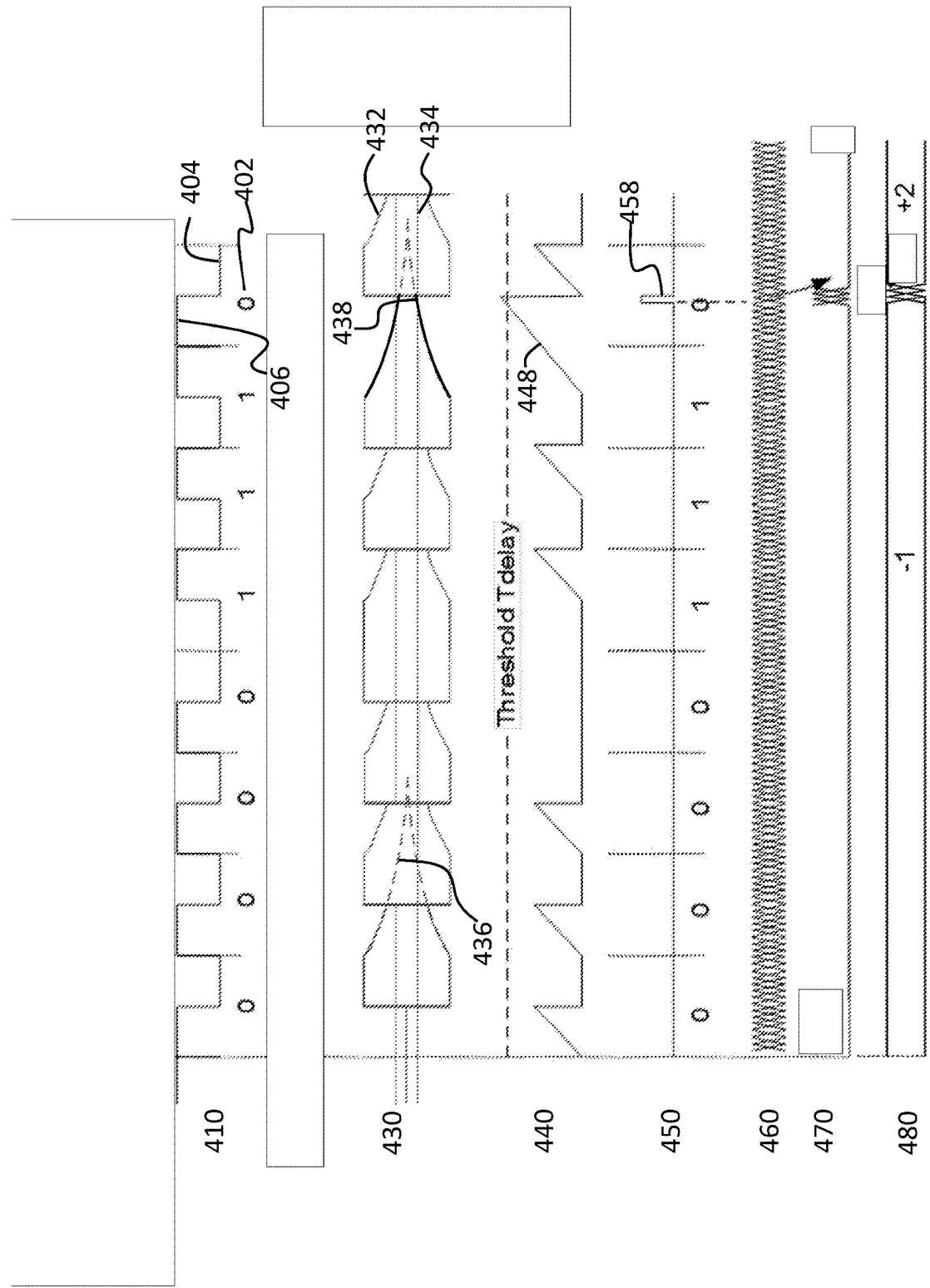
FIG. 4 shows various signals associated with embodiments of the present disclosure.

Turning now to FIG. 4, this figure shows various signals associated with embodiments of the present disclosure. At 410 is shown TX_ENV 402, that is to say the transmission signal from the controller, as a series of binary digits 402, along with the Manchester encoded data 404. In the example shown, the controller is configured to transmit on a low value of TX_ENV, and is not to transmit on a high value, although the skilled person will appreciate that another scheme such as 'transmit on high and not transmit on low' may be chosen. Thus, in the example shown the end of a transmission burst corresponds to a rising edge of the Manchester encoded data. For the encoding shown, the end of transmission burst thus occurs at the start of a "0" bit, and in the middle of a "1" bit—unless a "0" bit immediately follows a "1" bit, in which case the signal remains high during the first half of the "0" following the second half of the "1". An example of such a sequence is shown at 406.

Not shown in FIG. 4, is the field clock 420. Since the field clock is running at a relatively high frequency (for example 13.56 MHz), the resolution would not have been visible in FIG. 4. However, the figure does shows envelope data at 430. This comprises the signal envelope 432 at the receiver (RX) input, along with a reference level 434. The reference level 434 defines a level at which it is possible to determine the phase of a received signal above the decaying transmitted signal (which in this case acts as noise).

As can be seen in figure, the differential signal is high during bursts (that is, when the Manchester Encoded signal is low), and falls exponentially between bursts. (The skilled person will appreciate that a single ended signal, representing an amplitude of voltage level or power is equally possible instead of the differential signal shown.) The decay rate of this exponential fall is insufficient to cross the reference level—that is to say the signal is insufficiently damped—during the time of a single half-bit. The dashed lines 436 shows how the signal would have continued to decay if it was not reset—a "virtual decay". However, if the interval between bursts is sufficiently long—as shown at 438 for a whole bit interval—the decaying signal does cross the reference level.

At 440 is shown the output of the transmit envelope counter. This is reset to 0 on each falling edge of Manchester encoded signal 404—that is to say at the start of each transmission burst. At the end of each transmission burst the envelope counter starts to rise linearly, and continues to rise until the next falling edge of signal 404, corresponding to the start of the next transmission burst. When the interval between transmission bursts is a half bit, as described above, the counter does not cross the threshold delay. However when the interval is sufficiently long (as shown at 448), the counter does cross the threshold. When this occurs, the PLL operates to lock the phase of the local controller clock signal to the phase of the field clock signal. This is shown at the non-zero parts 458 of signal 450. Signal 450 shows when the PLL filtering value is updated: in this mode it works based on a phase error information which is not updated at every clock cycle. This phase error information is either forced to 0 (in a NAND implementation) either forced to previous value (in a flip-flop implementation). As shown this depends on the preceding and current bit value of transmission—for the Manchester encoding used here, it occurs only when the preceding bit is a "1" and the current bit is a "0".

Shown at 460 is the phase value at the output of the local phase detector LP D 246. And at 470 is shown the phase value at the filter input 248 (for a PLL design such as that shown in FIG. 2). The instantaneous phase error information at the LPD output is available at all the (typically 13.56 MHz) clock cycles, as seen on curve 460, whereas the phase error information actually given to the digital loop filter input is only updated during specific time windows, as seen on curve 470. Thus for embodiments such as that shown in FIG. 2 (NAND implementation for the logic 252), it is 0 most of the time and updated during the high level on curve 450.

Figure 5:
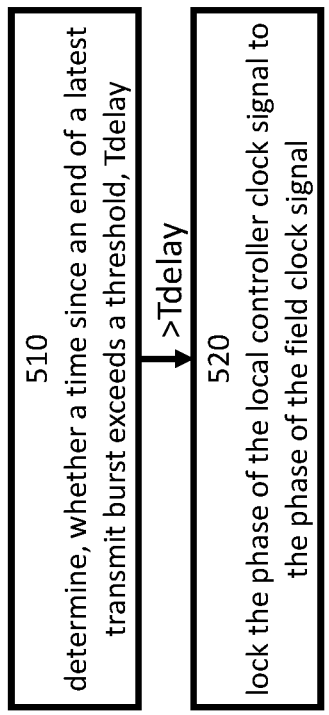
FIG. 5 shows a flowchart illustrating a method according to one or more embodiments.

Conversely, for embodiments such as that shown in FIG. 3, (having a flip-flop 352), the phase value is static most of the time and updated during the high level on curve 450. This is illustrated in FIG. 4 by the additional graph of phase value 480, of the filter inputs for the flip-flop implementation. The values "−1" and "+2" on phase value graph 480 are examples of a possible phase error sensed while TFEN is equal to 1. They are close to 0 showing the phase error is small but not completely null. During TFEN=0, the filter 248 adjusts its output (so the DCO input control is based on these previously detected −1 and +2 phase error values rather than on the current unreliable phase error values at LPD 246 output. FIG. 5 shows a flowchart according to a method of aligning a local controller clock signal (CLK_FB) to a receiving a field clock signal (CLK_FIELD) in a near field communication, NFC, controller operable in active load modulation, ALM, card mode, during a transmit mode comprising transmit bursts according to one or more embodiments. As shown in FIG. 5, the method, the method comprises, at step 510, determining whether a time since an end of a latest transmit burst exceeds a threshold, Tdelay. This may be done by means of a transmit envelop unit as described above. In response to the time since the end of the latest transmit burst exceeding the threshold Tdelay, the method further comprises selectively locking the phase of the local controller clock signal to the phase of the field clock signal, as shown at step 520.

Figure 6:
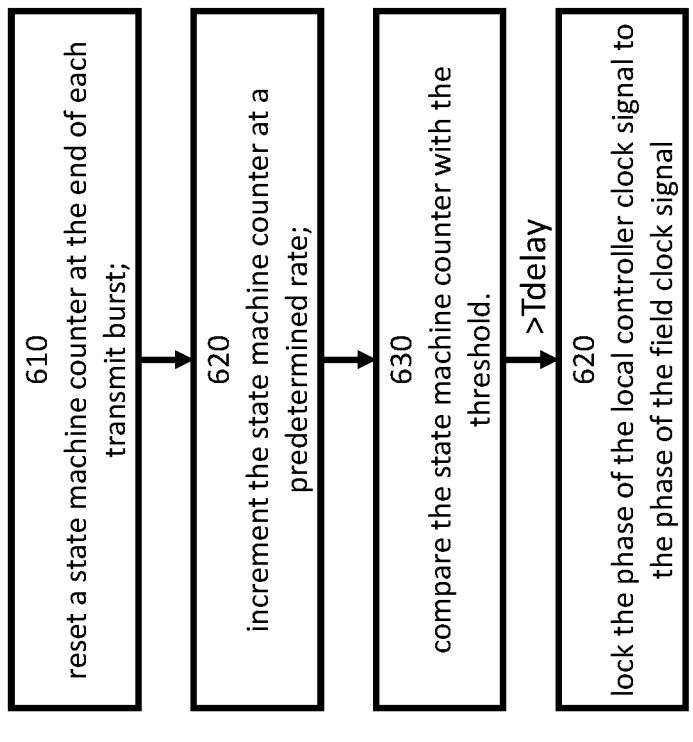
FIG. 6 shows a flowchart illustrating a method according to one or more other embodiments.

FIG. 6 shows a flowchart of a similar method according to one or more embodiments. This is similar to the method depicted in FIG. 5, except that determining whether the time since the end of the latest transmit burst exceeds the threshold comprises the following steps: at 610, resetting a state machine counter at the end of each transmit burst. It should be noted that resetting the state machine counter may mean resetting the counter to 0, or to some other baseline level above which the threshold is measured. At 620 the method includes incrementing the state machine counter at a predetermined rate. And at 630 the method includes comparing the state machine counter with the threshold.

Figure 7:
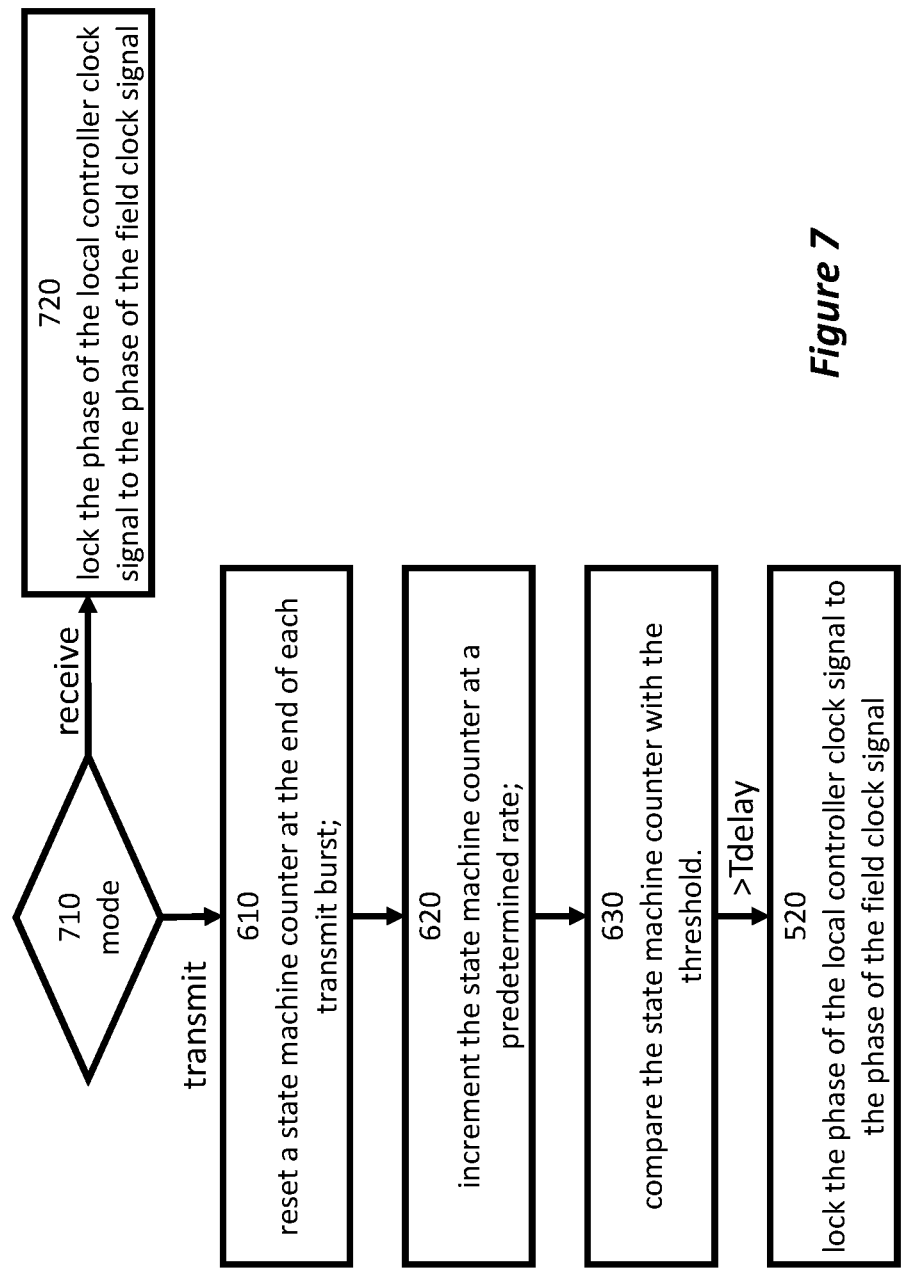
FIG. 7 shows a flowchart illustrating a method according to one or more yet further embodiments.

FIG. 7 shows a further flowchart of a further method according to one or more embodiments, this method is similar to that depicted in FIG. 6 except that it includes the further step of determining whether the control is operating in transmit or receive mode, as shown at 710. If the controller is operating in transmit mode, the method continues as per the method of FIG. 6; conversely if the controller is operating in receive mode, the phase of the local controller clock signal is locked to the phase of the field clock signal.

From reading the present disclosure, other variations and modifications will be apparent to the skilled person. Such variations and modifications may involve equivalent and other features which are already known in the art of NFC controllers with ALM and which may be used instead of, or in addition to, features already described herein.

In one or more embodiments, the gain of the receiver during transmit may be adjusted by means of the TFEN signal, thus: the gain is made sufficiently large when TFEN is 1 such that the CLK_FIELD signal can be generated by the receiver front end, and the gain is made sufficiently low when TFEN is 0 such that the receiver front end is not overloaded/saturated during transmit bursts. Preventing saturation allows to quickly make it operational during the phase alignment windows (when its gain is increased again).

A clock alignment module may further comprise an input for receiving a receive-mode signal indicative of operation in the receive mode. The input may be a separate input (not shown), or may be the TXENV input shown in FIGS. 2 and 3: this input may be asserted low during the receive mode. The phase locked loop, PLL, may then be further configured to lock the phase of the local controller clock signal to the phase of the field clock signal in response to the receive-mode signal. This configuration may be used by separate circuitry not shown, or through the digital part of the controller asserting the X and low during operation in receive mode.

The clock alignment module described herein above may be configured to be used in receive mode, according to NFC standard such as the NFC 'type A' standard defined in ISO_IEC_14443. Whereas typically, the field clock is continuously sensed during receive mode, for controllers operating in compliance with this standard, there may be one or more so-called "pause A short" time windows during which the reader does not transmit any power. Such a pause may last, according to the standard, for up to 4 µs. The clock alignment module described herein may be utilised in such a situation (for instance by asserting the transmit envelope signal high) in order to pause the attempted locking of the local clock to the field clock, since the field may have attenuated so to an extent that it cannot be reliably sensed during such a "pause A short" interval. Thus the PLL may be frozen to avoid it diverging due to the unreliably low field signal during the pause or gap.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

LIST OF REFERENCE SIGNS

110 Reader
120 Reader Integrated circuit
130 Antenna
135 Receive Module
140 Clock Generator
142 Modulator
144 Mixer
146 Front-end amplifier
160 NFC controller
170 Card IC
180 Antenna
185 Receive Module
190 Local Clock
192 Modulator
194 Mixer
196 Front-end amplifier
200, 300 clock alignment module
210 input
220 output
230 transmit envelope unit
232 state machine counter
234 multiplexer mux
240, 340 phase locked loop
242 digitally controlled oscillator
244 frequency divider
246 linear phase detector
248 loop filter
250 Sigma Delta modulator
252 combinatorial logic
352 Flip-flop
402 TX_ENV signal
404 Manchester encoded data
410 TX_ENV signal and data
420 Field clock
430 envelope data
432 signal envelope
434 reference level
436 virtual decay
438 whole bit interval decay
440 transmit envelope counter output
448 long interval counter output
450 PLL filtering
458 PLL filtering processing enabled
460 phase value at the LPD output
470 phase value at filter input
480 phase value at filter input
510, 520 method steps
610, 620, 630 method steps
710, 720 method steps

The invention claimed is:

1. A clock alignment circuit for a near field communication, NFC, controller operable in active load modulation, ALM, card mode, the module being operable during a transmit mode configured to generate transmit bursts, and comprising:
an input for receiving a field clock signal;
an output for outputting a local controller clock signal;
a transmit envelop unit configured to determine whether a time since an end of a latest transmit burst exceeds a threshold, Tdelay; and
a phase locked loop, PLL, configured to selectively lock the phase of the local controller clock signal to the phase of the field clock signal, in response to the time exceeding the threshold and a next transmit burst not having started.

2. The clock alignment circuit as claimed in claim 1, wherein the PLL comprises a digitally controlled oscillator and a frequency divider, and is configured to generate the local controller clock signal from a signal output by the digitally controlled oscillator and frequency divided by the frequency divider.

3. The clock alignment circuit as claimed in claim 1 wherein the phase locked loop is a digital phase locked loop.

4. The clock alignment circuit as claimed in claim 2, wherein the PLL is configured to allow the digitally controlled oscillator to run freely without locking the phase of the local controller clock signal to the phase of the field clock signal, in response to the time between transmit bursts not exceeding the threshold.

5. The clock alignment circuit as claimed in claim 1, wherein the transmit envelop unit comprises a state machine counter configured to be reset at the end of each transmit burst.

6. The clock alignment circuit as claimed in claim 5 wherein the phase locked loop is a digital phase locked loop.

7. The clock alignment circuit as claimed in claim 1, wherein the PLL comprises a linear phase detector, LPD, configured to compare the phase of the local controller clock signal and the field clock signal and a loop filter.

8. The clock alignment circuit as claimed in claim 7 wherein the phase locked loop is a digital phase locked loop, and the loop filter is a digital loop filter.

9. The clock alignment circuit as claimed in claim 1 and operable in a receive mode, further comprising an input for receiving a receive-mode signal indicative of operation in the receive mode, and wherein the phase locked loop, PLL, is further configured to lock the phase of the local controller clock signal to the phase of the field clock signal in response to the receive-mode signal.

10. A near field communication, NFC, controller, operable in active load modulation, ALM, card mode, and operable during a transmit mode configured to generate transmit bursts, the NFC controller comprising:
a clock alignment circuit having:
an input for receiving a field clock signal;
an output for outputting a local controller clock signal;
a transmit envelop unit configured to determine whether a time since an end of a latest transmit burst exceeds a threshold, Tdelay; and
a phase locked loop, PLL, configured to selectively lock the phase of the local controller clock signal to the phase of the field clock signal, in response to the time exceeding the threshold and a next transmit burst not having started;
the NFC controller further comprising
an active modulator configured to generate modulations in a signal having a predefined phase relationship with the local controller clock signal;
and an antenna configured to transmit the modulated signal.

11. The near field communication, NFC, controller, as claimed in claim 10, wherein the clock alignment circuit further comprises one or more control parameter inputs configured to receive control parameters, for adjusting the gain of the PLL in dependence on whether the control is operating in a transmit mode or a receive mode.

12. The near field communication, NFC, controller as claimed in claim 11 and further operable in a receive mode, wherein the transmit envelope unit is further configured to suspend operation of the PLL in response to identifying a gap in the field signal.

13. An integrated circuit for use in the NFC controller as claimed in claim 11, and comprising a clock alignment circuit as claimed in claim 1, and an active modulator configured to generate a modulation in a signal having a predefined phase relationship with the local controller clock signal.

14. A method of aligning a local controller clock signal to a receiving a field clock signal in a near field communication, NFC, controller operable in active load modulation, ALM, card mode, during a transmit mode configured to generate transmit bursts, the method comprising:

determining, by means of a transmit envelop unit, whether a time since an end of a latest transmit burst exceeds a threshold, Tdelay;

and selectively locking the phase of the local controller clock signal to the phase of the field clock signal, in response to the time exceeding the threshold and a next transmit burst not having started.

15. The method of claim 14, wherein locking the phase of the local controller clock signal to the phase of the field clock signal comprising controlling a phase locked loop.

16. The method of claim 14, wherein determining, by means of a transmit envelop unit, whether a time since an end of a latest transmit burst exceeds a threshold, Tdelay comprises:

resetting a state machine counter at the end of each transmit burst;

incrementing the state machine counter at a predetermined rate; and comparing the state machine counter with the threshold.

17. The method of claim 14, further comprising locking the phase of the local controller clock signal to the phase of the field clock signal, in response to the NFC controller operating in a receive mode.

18. The method of claim 15, wherein the field clock signal is derived from a field, and further comprising locking the phase of the local controller clock signal to the phase of the field clock signal, in response to the NFC controller operating in a receive mode and freezing the operation of the PLL in response to detecting a gap in the power of the field.

\* \* \* \* \*